United States Patent [19]

Koike et al.

[11] 4,143,389

[45] Mar. 6, 1979

[54] PHOTOELECTRIC ELEMENT IN A SOLID-STATE IMAGE PICK-UP DEVICE

[75] Inventors: Norio Koike, Musashino; Masaharu Kubo, Hachioji, both of Japan

[73] Assignee: Hitachi, Ltd., Japan

[21] Appl. No.: 823,646

[22] Filed: Aug. 11, 1977

[30] Foreign Application Priority Data

Aug. 16, 1976 [JP] Japan .................................. 51-97084

[51] Int. Cl.² .................................................. H01L 27/14
[52] U.S. Cl. ........................................ 357/31; 357/23; 357/30; 357/14; 357/24
[58] Field of Search ................ 357/23, 30, 31, 41, 357/14, 24

[56] References Cited

U.S. PATENT DOCUMENTS

| | | | |
|---|---|---|---|
| 3,877,057 | 4/1975 | Engeler | 357/24 |
| 3,877,058 | 4/1975 | Cricchi | 357/24 |
| 3,906,544 | 9/1975 | Engeler | 357/24 |
| 3,996,658 | 12/1976 | Takei et al. | 29/571 |
| 4,060,796 | 11/1977 | Togei et al. | 365/183 |

Primary Examiner—Martin H. Edlow
Attorney, Agent, or Firm—Craig & Antonelli

[57] ABSTRACT

In a solid-state image pickup device having photoelectric elements each of which includes one or more switching MOS field-effect transistors and which are arrayed in one dimension or two dimensions on one semiconductor substrate, and scanning circuits which address the photoelectric devices time-sequentially, a transparent or semitransparent electrode is disposed over a light detecting region provided for the switching field-effect transistor, with an insulating oxide film intervening therebetween, whereby a capacitance is formed between the electrode and the substrate, charges generated under the electrode by photoexcitation are stored in a charge-storage region including the capacitance for a certain time, and the stored charges are taken out by the scanning circuits to a signal output line connecting the drains of the transistors in common.

7 Claims, 9 Drawing Figures

PHOTOELECTRIC ELEMENT IN A SOLID-STATE IMAGE PICK-UP DEVICE

BACKGROUND OF THE INVENTION

1. Field of the Invention

The invention relates to a photoelectric element in a solid-state image pickup device in which a large number of photoelectric elements and scanning circuits for taking out optical information of the photoelectric elements are integrated on a semiconductor substrate.

2. Description of the Prior Art

The principle of such a solid-state image pickup device is described in detail in a paper by Savvas G. Chamberlain, entitled "Photosensitivity and Scanning of Silicon Image Detector Arrays", reported in IEEE Journal of Solid-State Circuits. Vol. SC-4, No. 6, December 1969, pp. 333-342. The device described therein is made up of metal-oxide insulated-gate semiconductor transistors (hereinbelow, abbreviated MOSTs) which are arranged in the form of a matrix on a silicon substrate. The source of the MOST and the substrate constitute a photodiode. Light incident on the photodiode creates charges, and the charges are stored in the capacitance of the photodiode. The charges thus stored are read out to a signal output line connecting the drains of the MOSTs in common, by driving the MOSTs by means of scanning circuits for X- and Y-directions.

A solid-state image pickup device should have a resolution power common for image pickup tubes which are used in current television broadcast circuits, and it therefore requires 500 × 500 photoelectric elements as well as corresponding switches for x-y addressing and scanning circuits each having 500 stages for turning the switches "on" and "off". Accordingly, the device is ordinarily fabricated with MOS. LSI technology with which a high density of integration is comparatively easily achieved.

Since the solid-state image pickup device constructed as described above can have the photoelectric elements and the switches fabricated in a monolithic structure, it is suited for integration. Since it uses the MOSTs, it has the advantage of low power dissipation. The degree to which the photodiodes can be integrated is accordingly comparatively large; yet, it is to the extent of an array of 100 × 100. The solid-state image pickup device of this type involves serious problems as mentioned below.

1. Charges created by the incident light are stored in the capacitance of the diode. In order to attain the required signal-to-noise ratio, a predetermined diode capacitance is necessary. The capacitance of the junction diode is generally 1 pF for each 100 μm square and a value of 50 μm square is needed in order to obtain the required signal-to-noise ratio. In the case of integrating an array of 500 × 500 diodes, the IC chip size of the image pickup devices reaches 25mm square. Considering that the present-day size is 2-3mm square in an ordinary chip and 7mm square even in the greatest chip, fabrication of the IC of 25mm square is extremely difficult.

2. As is well known, an IC photo-mask is required in order to fabricate an image pickup IC. The size of a chip which can be formed by one-shot photography at present is 10mm square. A chip of 25mm square must accordingly be fabricated by a method wherein the chip size is divided in two in each of x- and y-directions, i.e. on the whole into four blocks, which are photographed separately and then joined to one another. This complicates the manufacture of the masks. Moreover, an image obtained by the image pickup device produced by using the divided masks includes white (or black) lines corresponding to the joints which run longitudinally and laterally, and the picture quality is degraded.

SUMMARY OF THE INVENTION

It is, accordingly, an object of the invention to improve the structure of the prior-art photoelectric element and to reduce the occupying area thereof, and in turn, the size of the image pickup device. In order to achieve the object, an electrode maintained at a predetermined voltage is provided over a light detecting region, a typical example of which is a diode junction, over an insulating film so that the occupying area of the diode is reduced and that the storage capacitance may be increased.

While the invention will now be described in detail in connection with some preferred embodiments thereof, with reference to the accompanying drawing, it is a matter of course that they are for elucidation only and that various modifications and alterations are possible without departing from the spirit of the invention.

DESCRIPTION OF THE PRIOR ART

Figure 1:
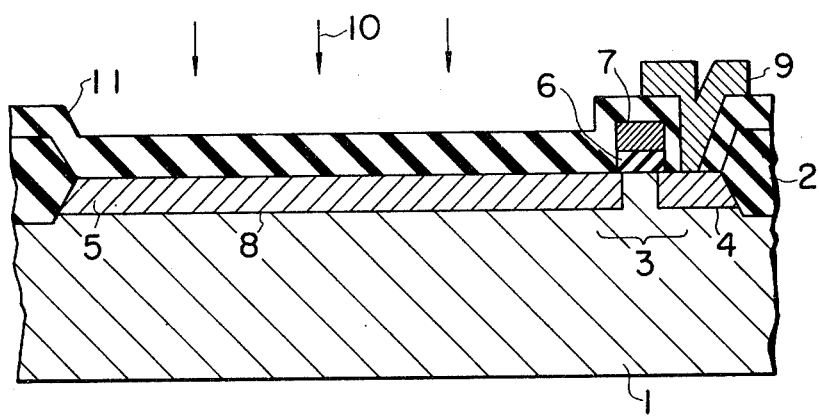
FIG. 1 is a sectional view of a photoelectric element in a prior-art solid-state image pickup device.

In order to clarify the advantage of a photoelectric element according to the invention, attention is directed to FIG. 1, which shows the structure of a prior-art photoelectric element in the case of adopting the LOCOS process (Local Oxidation of Silicon) which offers a particularly high density of integration among the MOS techniques. In the Figure, numeral 1 designates a semiconductor substrate, numeral 2 an insulating oxide film for isolating devices as formed by the LOCOS process (for which $SiO_2$ is generally employed), and numeral 3 a switching MOS field-effect transistor. The MOST 3 is made up of a drain 4 and a source 5 in which an impurity of the conductivity type opposite to that of the substrate 1 are diffused, and a gate electrode 7 which is provided between the drain and source through an insulating oxide film 6. A junction 8 which is defined between the source 5 and the substrate 1 is used as a photodiode for the photoelectric conversion. The drain 4 is joined to a signal output line 9 (for which a conductive material Al is generally used). When a scanning pulse from a scanning circuit is impressed on the gate electrode 7, light signal charges which have been created in correspondence with light 10 falling on the diode and which have been stored in the junction capacitance possessed by the photodiode are taken out at the drain 4 and accordingly, the signal output line 9. Shown at 11 is an insulating oxide film for the insulation between the gate electrode 7 and the signal output line 9. As is apparent from the above description, in the prior-art device, the unit area per element is determined from the required storage capacitance, which is proportional to the area of the source, and therefore it is impossible to remarkably enhance the density of integration.

DETAILED DESCRIPTION OF THE INVENTION

EXAMPLE 1

Figure 2:
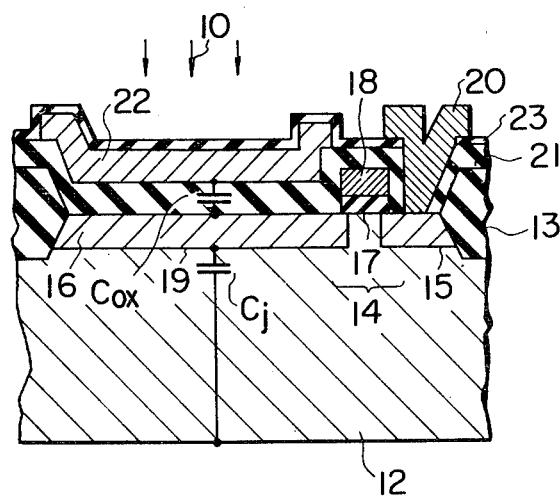
FIG. 2 is a sectional view of a photoelectric element in a solid-state image pickup device according to the invention.
Figure 3:
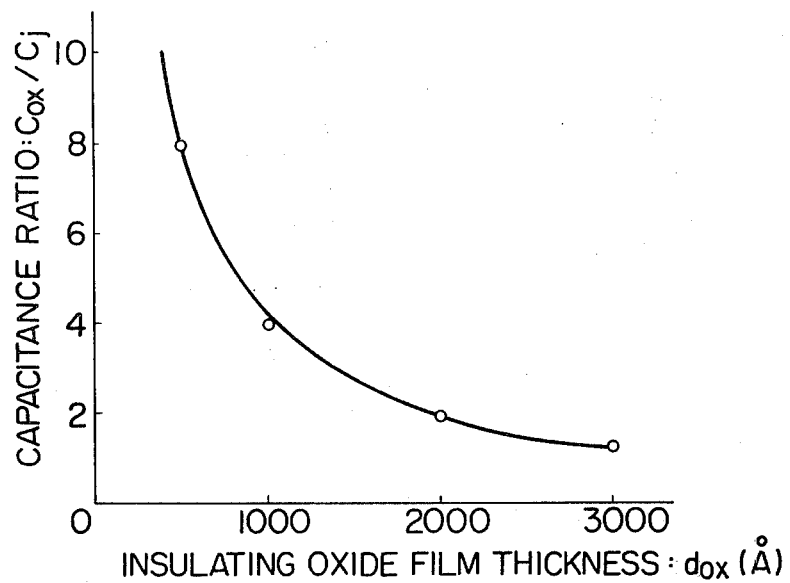
FIG. 3 is a diagram which illustrates the relationship between the insulating oxide film thickness and the capacitance ratio for explaining the effect of the invention.

FIG. 2 shows an example of the fundamental structure of a photoelectric element according to the invention. In the figure, numeral 12 designates a semiconductor substrate, numeral 13 designates an insulating oxide film (first oxide film) formed by the LOCOS process, and numeral 14 designates a switching MOST. The MOST 14 is so constructed that a gate electrode 18 is provided over a gate insulating oxide film 17 between a drain 15 and a source 16 in which an impurity of the conductivity type opposite to that of the substrate is diffused. A junction photodiode 19 formed by the source 16 and the substrate 12 is used for photoelectric conversion. Numeral 20 indicates a signal output wiring which is connected to the drain 15 of the MOST 14 through a hold formed in a second oxide film 21 as well as a third oxide film 23. Numeral 22 represents an electrode which is provided so as to cover the photodiode area over the second oxide film 21, and which constitutes the essential part of the invention. As the material of the electrode 22, one permitting light to permeate down to the diode surface is suitable. For example, a transparent electrode made of $SnO_2$ or $InO_2$ or a semi-transparent electrode made of polycrystalline silicon can be used. Further, even a metallic electrode, such as of Al can be satisfactorily used by making the film thickness of the electrode small. When the electrode 22 is maintained at a predetermined voltage (which may be, for example, zero volts), a capacitance is formed between electrode 22 and the source for the photodiode 16. In the structure according to the invention, therefore, the oxide film capacitance is added to the junction capacitance $C_j$ of the diode itself. This oxide film capacitance $C_{ox}$ is determined by the junction area $S_j$ of the diode and the thickness $d_{ox}$ of the second oxide film 21, and is given by the following equation:

$$C_{ox} = E_{ox} \cdot S_j/d_{ox} \tag{1}$$

where $E_{ox}$ denotes the dielectric constant of the oxide film. Although the oxide film capacitance depends also on the film thickness $d_{ox}$, it is generally larger than the junction capacitance $C_j$. FIG. 3 is a graph obtained in such a way that the ratio of the oxide film capacitance given by Equation 1 to the junction capacitance ($C_{ox}/C_j$) was calculated as a function of the oxide film thickness. Here, in calculating the junction capacitance, the specific resistance of the substrate was selected at 5-10 $\Omega \cdot$ cm which is most commonly used in integrated circuits including the solid-state image pickup device. As will be understood from the graph, the oxide film capacitance $C_{ox}$ is four times as great as the junction capacitance at an oxide film thickness of 1000 Å and eight times at an oxide film thickness of 500 Å, so the occupying area necessary for a same signal storage capacitance becomes 1/5 to 1/9 or less in the diode employing the oxide film capacitance according to the invention, as compared with the diode of the prior-art structure. The thickness $d_{ox}$ of the oxide film was selected to be 1000 Å at which there is no problem of the blocking voltage, and the design layout of a photodiode was based on the present structure. As a result, the occupying area of the photoelectric element including the switch can be made 20 μm × 27 μm. This is ¼ of the occupying area of the photoelectric element of the prior-art structure. In the case of further thinning the oxide film and selecting the thickness $d_{ox}$ at 500 Å, which is the minimum value of the present-day technology, the occupying area can be easily reduced below 1/7 of the value of the prior art.

The manufacturing steps of the photoelectric element of the structure according to the invention will now be explained with reference to FIGS. 4A through 4E.

Figure 4A:
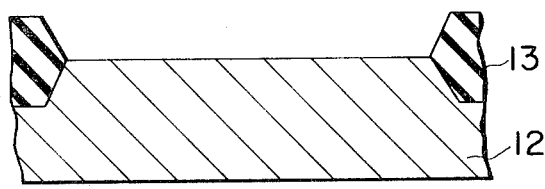
FIG. 4A-4E are sectional views which illustrate the manufacturing steps of the photoelectric element in the solid-state image pickup device according to the invention.

As is shown in FIG. 4A, a first oxide film 13 is selectively formed on a substrate 12 by the LOCOS process.

Figure 4B:
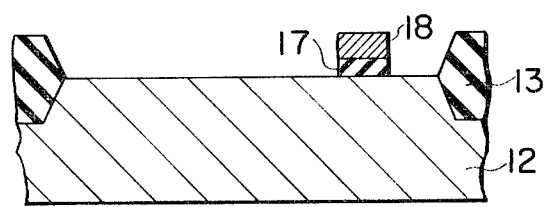

Next, as shown in FIG. 4B, an oxide film for a gate 17 is formed by thermal oxidation, and polycrystalline silicon layer 18 for a gate electrode is deposited thereon by, for example, the CVD process (Chemical Vapor Deposition). Further, the polycrystalline silicon layer, other than a portion corresponding to a gate region, is removed by the photoetching method, and using the resultant gate electrode as a mask, the gate oxide film outside the gate electrode is removed by etching.

Figure 4C:
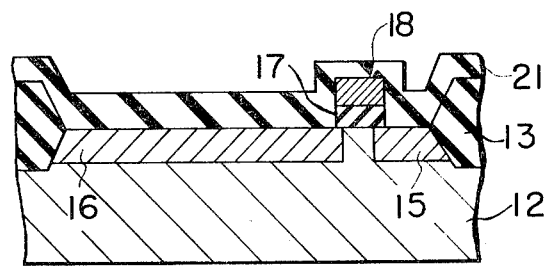

Then, as illustrated in FIG. 4C, an impurity of the conductivity type opposite to that of the substrate is diffused by thermal diffusion, to form a drain 15 and a source 16 (photodiode). The impurity simultaneously diffuses into the polycrystalline silicon layer for the gate, to increase the conductivity of the polycrystalline silicon layer. Thereafter, a second oxide film 21 is formed over the entire surface. The fabricating steps thus far described are the same as those for the prior-art photoelectric element shown in FIG. 1.

Figure 4D:
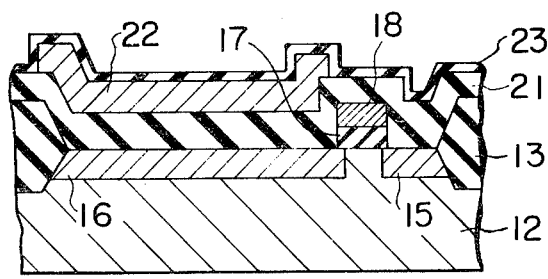

Now, as shown in FIG. 4D, a transparent conductive film, for example, 5000 Å-10000 Å thick, a polycrystalline silicon layer, for example, 2000 Å-5000 Å thick, or a metallic thin film, for example, 300 Å-3000 Å thick, is provided on the second oxide film by, for example, evaporation. Subsequently, the film or material is removed so as to leave its region overlying the photodiode, to thereby obtain an electrode 22 for forming the oxide film capacitance $C_{ox}$. Here, in case of employing polycrystalline silicon for the electrode, it should be doped with an impurity of the opposite conductivity type to that of the substrate either by the diffusion process or by the ion implantation process in order to enhance the conductivity of the material. Further, a third oxide film 23 is formed.

Figure 4E:
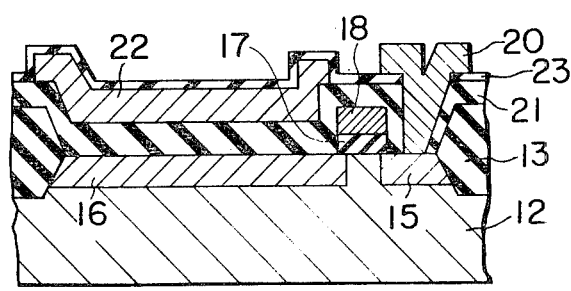

Finally, as shown in FIG. 4E, second and third oxide films overlying the drain are removed by photoetching, and an Al film is deposited over the entire surface by evaporation. Thereafter, the Al, except for a wiring portion for signal output 20, is removed by photoetching. Thus, fabrication of the device is completed. Scanning circuits arranged in the peripheral part with respect to the photoelectric elements may also be fabricated by the steps illustrated in FIGS. 4A through 4E (their illustration has been omitted).

As set forth above, the photoelectric elements of the invention can be simply produced by adding the above last two steps to the steps for fabricating the element of the prior-art structure.

EXAMPLE 2

Figure 5:
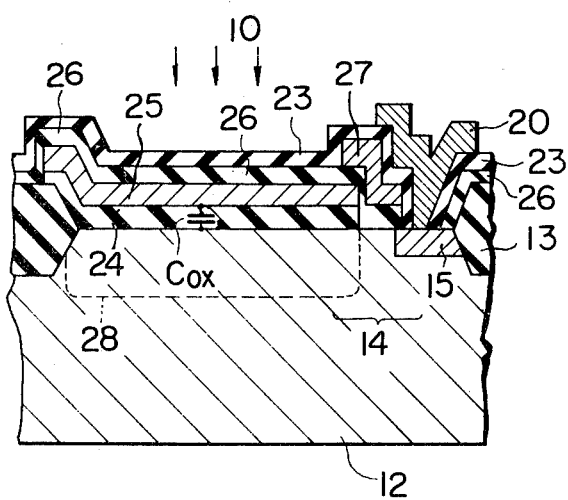
FIG. 5 is a sectional view of a photoelectric element in another solid-state image pickup device according to the invention.

Regarding the structure of the photoelectric element of the invention, various structures can be devised besides that depicted in FIG. 2. FIG. 5 shows another embodiment of the photoelectric element according to the invention. Numeral 25 designates an electrode which is provided over a substrate 12 having a second oxide film 24 thereon. The oxide capacitance for signal-charge storage, $C_{ox}$, is formed between this electrode and the substrate. Numeral 27 denotes a gate electrode which is provided on a gate oxide film 26. In the present embodiment, the source junction 16 for the diode, as provided in FIG. 2, is not formed, and only the oxide film capacitance is utilized for storing signal charges. It is, accordingly, necessary to apply to the electrode for storage 25 a voltage which is required for forming a depletion layer 28 in the semiconductor surface beneath the electrode 25. The signal charges created by light are accumulated in the depletion layer. Since no source junction is provided in the present embodiment, all the charges generated by the incident light can be converted into a light signal. This brings forth the merit that the photosensitivity, especially the sensitivity to short-wavelength light, can be enhanced.

The manufacturing process of the element of the present structure will be briefly explained. In the present structure, the source junction is not disposed as stated previously. Therefore, when the gate electrode 27 is provided under the electrode 25, there is the danger that a region of low conductance will appear in the semiconductor surface between the electrode 25 and the gate electrode 27 and that the conduction resistance of a switch 14 will become high. In order to prevent such a drawback, the present embodiment adopts a structure in which the gate electrode 27 partially overlaps the electrode 25. Accordingly, the fabricating process is somewhat different from that illustrated in FIGS. 4A through 4E, and after forming the electrode 25, the gate oxide film 26 is formed to make the gate electrode.

As described above in connection with the embodiments, according to the photoelectric element of the invention, an electrode to which a predetermined voltage is applied is provided over a substrate and impurity layer-junction region forming a photodiode, with an insulating oxide film disposed between the electrode and the junction region, whereby the photoelectric element of small occupying area and large storage capacitance can be produced. Further, even when the element does not include an impurity layer junction, a depletion layer is formed in the surface of the semiconductor substrate by providing an electrode over the substrate semiconductor via an insulating oxide film and applying a predetermined voltage to this electrode, and it can be used for the photoelectric conversion. Accordingly, a solid-state image pickup device which has a smaller chip area and larger number of picture elements or higher resolving power than the prior-art device can be obtained by arraying the photoelectric elements of the invention in two dimensions. Obviously, the effect of the invention in practical use is very great.

Although the invention has been described as using the MOST as the constituent unit of the image pickup devices, it is applicable to solid-state image pickup devices having similar constructions, such as those employing a junction field-effect transistor, a bipolar transistor and a charge transfer device, within a scope not departing from the purpose of the invention.

While we have shown and described several embodiments in accordance with the present invention, it is understood that the same is not limited thereto but is susceptible of numerous changes and modifications as known to a person skilled in the art, and we therefore do not wish to be limited to the details shown and described herein but intend to cover all such changes and mofidications as are obvious to one of ordinary skill in the art.

We claim:

1. A photoelectric element in a solid-state image pickup device comprising:
    a field-effect transistor, disposed in one surface portion of a semiconductor substrate of a first conductivity type, including a source region and a drain region having a second conductivity type opposite to said first conductivity type, a gate insulating film provided so as to cover a portion of said substrate lying between said source region and said drain region, and a gate electrode provided on said gate insulating film, one of said source region and said drain region being larger than the other and constituting, together with said substrate, a photodiode;
    a transparent insulating oxide film which is provided so as to cover said photodiode; and
    a transparent electrode which is provided on said insulating oxide film and which permits at least part of incident light to permeate therethrough, said transparent electrode being maintained at a predetermined voltage and forming an electrostatic capacitance with said one region.

2. A photoelectric element in a solid-state image pickup device according to claim 1, wherein said transparent electrode is made of a material selected from the group consisting of tin oxide, idium oxide, polycrystalline silicon, and a thin aluminum layer.

3. A photoelectric element in a solid-state image pickup device comprising:
    a field-effect transistor, disposed in one surface portion of a semiconductor substrate of a first conductivity type including a first region having a second conductivity type opposite to said first conductivity type, a gate insulating film provided so as to cover a first portion of said substrate adjacent to said first region, a gate electrode provided on said gate insulating film, and a photosensitive second portion of said substrate adjacent to said first portion of said substrate, the entirety of said photosensitive portion being exclusive of second conductivity type semiconductor material;
    a transparent insulating oxide film which is provided so as to cover said photosensitive region; and
    a transparent electrode which is provided on said insulating oxide film and which permits at least part of incident light to permeate therethrough, said transparent electrode being maintained at a predetermined voltage and forming a depletion layer in said photosensitive portion, said transparent electrode and said photosensitive portion forming an electrostatic capacitance, said depletion layer functioning as a field-effect transistor together with said first region and said gate electrode.

4. A photoelectric element in a solid-state image pickup device according to claim 3, wherein said transparent electrode is made of a material selected from the group consisting of tin oxide, indium oxide, polycrystalline silicon layer and a thin aluminum layer.

5. A photoelectric element in a solid-state image pickup device according to claim 3, wherein said transparent electrode is covered with another insulating film, and said gate electrode extends over said transparent electrode.

6. A photoelectric element in a solid-state image pickup device according to claim 5, wherein the projection of an edge of said gate electrode towards said substrate overlaps said transparent electrode.

7. A photoelectric element in a solid-state image pickup device according to claim 1, wherein that larger one of said source region and said drain region which forms a photodiode with said substrate extends over the entire extent of the surface of said substrate upon which light is incident by permeation through said transparent electrode.

* * * * *